(12) United States Patent
Randlett et al.

(10) Patent No.: US 7,911,366 B2
(45) Date of Patent: Mar. 22, 2011

(54) GRAY CODE CURRENT MODE ANALOG-TO-DIGITAL CONVERTER

(75) Inventors: Richard W. Randlett, Palo Alto, CA (US); Zonggi Hu, Fremont, CA (US)

(73) Assignee: Exar Corporation, Fremont, CA (US)

( * ) Notice: Subject to any disclaimer, the term of this patent is extended or adjusted under 35 U.S.C. 154(b) by 176 days.

(21) Appl. No.: 12/212,039

(22) Filed: Sep. 17, 2008

(65) Prior Publication Data

US 2010/0066579 A1   Mar. 18, 2010

(51) Int. Cl.
*H03M 1/12* (2006.01)

(52) U.S. Cl. ......................................... 341/135; 341/136
(58) Field of Classification Search .................. 341/135, 341/136, 155
See application file for complete search history.

(56) References Cited

U.S. PATENT DOCUMENTS

| | | | |
|---|---|---|---|
| 3,187,325 A | | 6/1965 | Waldhauer |
| 4,667,180 A | * | 5/1987 | Robinson ...................... 341/135 |
| 4,675,651 A | * | 6/1987 | Marbot et al. ................. 341/135 |
| 4,745,395 A | * | 5/1988 | Robinson ...................... 341/135 |
| 5,283,582 A | * | 2/1994 | Krenik .......................... 341/158 |
| 5,572,153 A | * | 11/1996 | Vallancourt et al. .......... 341/136 |
| 6,313,780 B1 | * | 11/2001 | Hughes et al. ................ 341/156 |
| 6,972,706 B2 | * | 12/2005 | Snoeijs ......................... 341/158 |
| 2007/0139241 A1 | | 6/2007 | Hales et al. |

OTHER PUBLICATIONS

U.S. International Searching Authority, International Search Report and Written Opinion for International Appln. No. PCT/US2009/055929, Oct. 19, 2009, 8 pages.

* cited by examiner

*Primary Examiner* — Howard Williams
(74) *Attorney, Agent, or Firm* — Fliesler Meyer LLP

(57) ABSTRACT

One embodiment of the present invention is a Gray code current-mode analog to digital (ADC) converter using a Gray code current-mode ADC building block. The Gray code current-mode ADC building block can produce a Gray code bit and a current output that is sent to a next Gray code ADC building block. In one embodiment, the Gray code current-mode ADC building block does not use a voltage comparator in a signal path of the current output. In one embodiment, an 8 bit analog-to-digital converter can have a 65 ns conversion time and consume only 10 mW of power with a single +5.0V supply.

20 Claims, 21 Drawing Sheets

Gray Code - Binary Code Comparison

| Binary Code | | | | Gray Code | | | | Decimal |
|---|---|---|---|---|---|---|---|---|
| 0 | 0 | 0 | 0 | 0 | 0 | 0 | 0 | 0 |
| 0 | 0 | 0 | 1 | 0 | 0 | 0 | 1 | 1 |
| 0 | 0 | 1 | 0 | 0 | 0 | 1 | 1 | 2 |
| 0 | 0 | 1 | 1 | 0 | 0 | 1 | 0 | 3 |
| 0 | 1 | 0 | 0 | 0 | 1 | 1 | 0 | 4 |
| 0 | 1 | 0 | 1 | 0 | 1 | 1 | 1 | 5 |
| 0 | 1 | 1 | 0 | 0 | 1 | 0 | 1 | 6 |
| 0 | 1 | 1 | 1 | 0 | 1 | 0 | 0 | 7 |
| 1 | 0 | 0 | 0 | 1 | 1 | 0 | 0 | 8 |
| 1 | 0 | 0 | 1 | 1 | 1 | 0 | 1 | 9 |
| 1 | 0 | 1 | 0 | 1 | 1 | 1 | 1 | 10 |
| 1 | 0 | 1 | 1 | 1 | 1 | 1 | 0 | 11 |
| 1 | 1 | 0 | 0 | 1 | 0 | 1 | 0 | 12 |
| 1 | 1 | 0 | 1 | 1 | 0 | 1 | 1 | 13 |
| 1 | 1 | 1 | 0 | 1 | 0 | 0 | 1 | 14 |
| 1 | 1 | 1 | 1 | 1 | 0 | 0 | 0 | 15 |

For Gray Code: One Bit Change for Each Incremental LSB Increase/Decrease in Code Value

FIG. 2

Grey Code ADC Front End $I_{in} = V_{in}/R$

US 7,911,366 B2

GRAY CODE CURRENT MODE ANALOG-TO-DIGITAL CONVERTER

BACKGROUND

Voltage mode Gray code A/D converters, such as that of FIG. 1A, are based on a series connection of analog operators, one for each bit, each of which is designed to process the following algorithm:

$$V_{out} = abs[2(Vin - Vref)]$$

where $V_{ref} = 0.5$ Vin full scale

Prior to taking the absolute value, the sign of $(V_{in} - V_{ref})$ is observed and determines the logic state, one or zero, of each respective bit. For the MSB (most significant bit) a positive polarity remainder equals a logic one, a negative remainder equals a logic zero. The converse is true for all successive lower order bits, positive remainder equals logic zero, and negative remainder equals one. Utilizing this rule, the output of the ADC is Gray code proportional to the analog input $V_{in}$. FIG. 2 shows a comparison of straight binary code vs. Gray code.

The remainder is multiplied by 2 before the absolute value is taken and passed on to the next succeeding stage. This allows normalization of $V_{ref}$ to a constant single value for each stage and reduces the accuracy requirement of each succeeding stage by a factor of 2.

Unlike other types of A/D converters, the Gray code converter requires no clocking of each bit. Ideally, the input voltage propagates through the circuit and produces valid code after a delay time equal to the summation of delay times associated with each analog operator.

The Gray code is an un-weighted binary code that changes by only one bit for each incremental increase or decrease in LSB value. This characteristic contrasts sharply with straight binary where all bits may be changing for a one bit incremental change in value. For example, the code change for the half-full-scale major carry of an 8 bit code is 01111111 to 10000000. As a result, an ADC with intrinsic Gray code output is well suited to asynchronous strobing of the data output without being susceptible to large scale errors.

Most existing implementations of the aforementioned Gray code algorithm take on the form, in one way or another, of the block diagram in FIG. 1B. Note that this architecture places a comparator, C1 in the signal path. A valid signal cannot move forward to the next stage until C1 has resolved the polarity of the difference between $V_{in}$ and $V_{ref}$ and closed the appropriate switch, S1 or S2, to generate the absolute value output. Switch closure, be it voltage mode or current mode, introduces discontinuities in the signal path. All of the above significantly increases the propagation delay through each stage.

One self-steering architecture, as proposed by F. D. Waldauer (U.S. Pat. No. 3,187,325), presents an ideal case for voltage steering but is not implementable in a practical sense due to a lack of isolation between stages and the resultant instabilities created by parasitic positive feedback loops.

The Waldauer architecture is based on a balanced differential, voltage routing topology. This disclosure describes a balanced differential current routing topology.

The Waldauer architecture has fundamental issues with operational amplifier stability in its implementation due to poor analog operator input-output isolation.

BRIEF DESCRIPTION OF THE DRAWINGS

FIG. 2 shows a conversion between Gray code and binary.

DETAILED DESCRIPTION

Figure 1A:
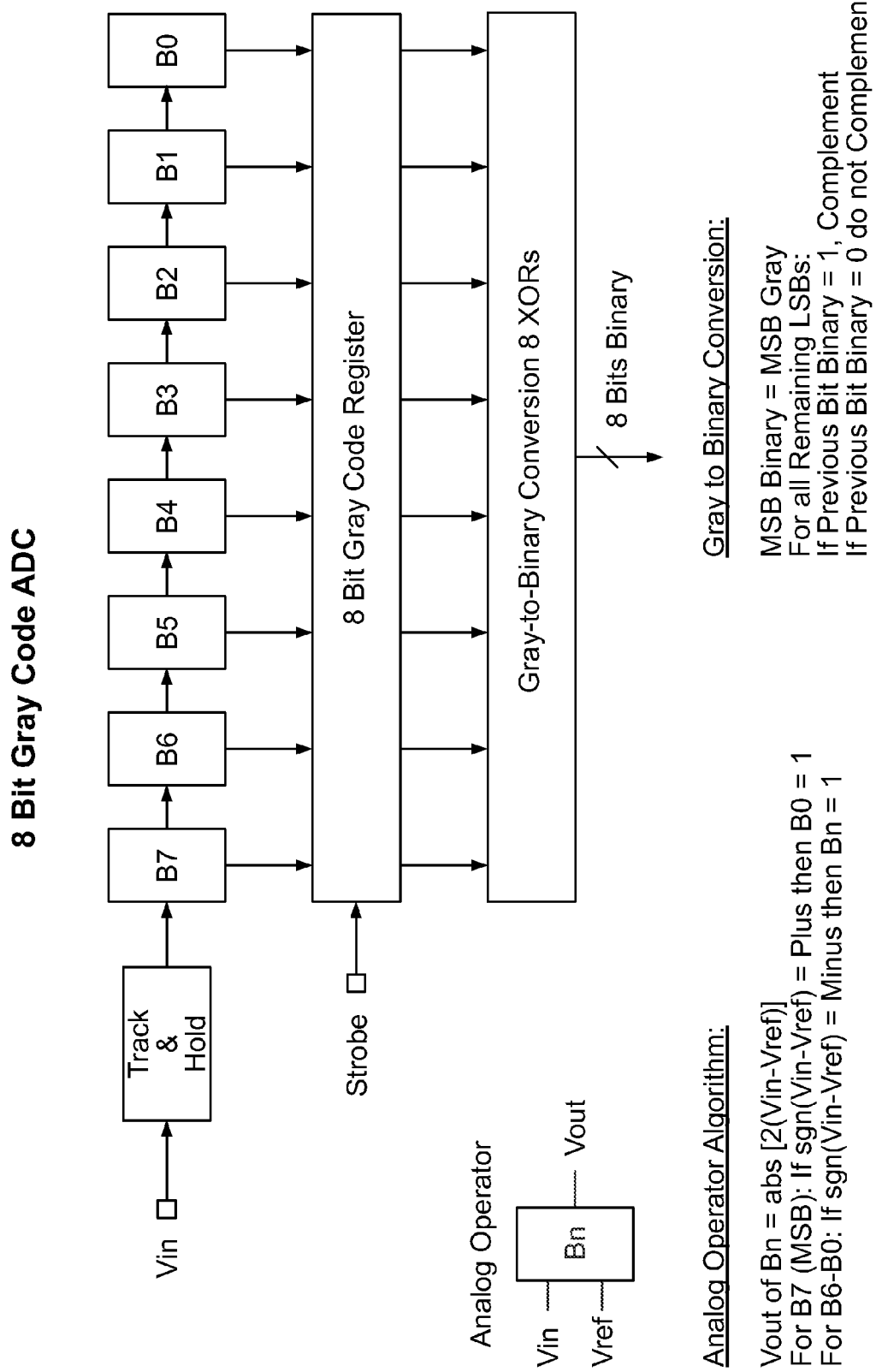
FIGS. 1A and 1B show a prior art Gray code voltage mode ADC converter.
Figure 1B:
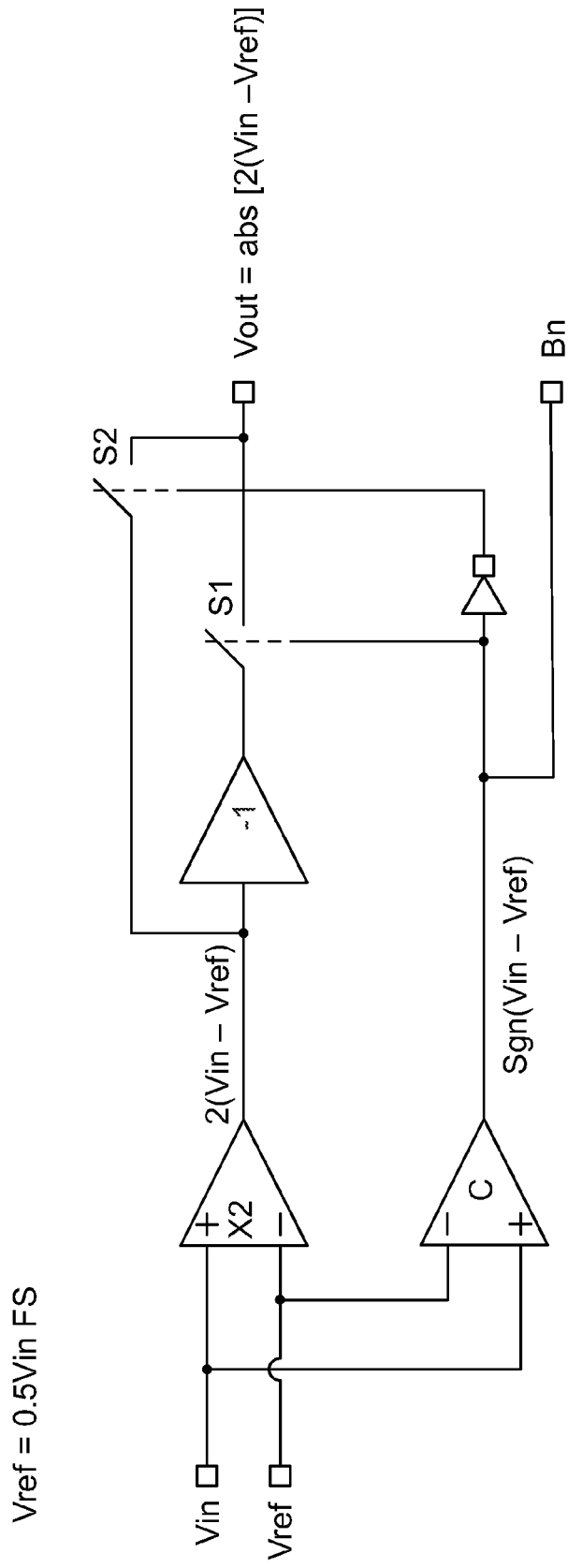
Figure 3:
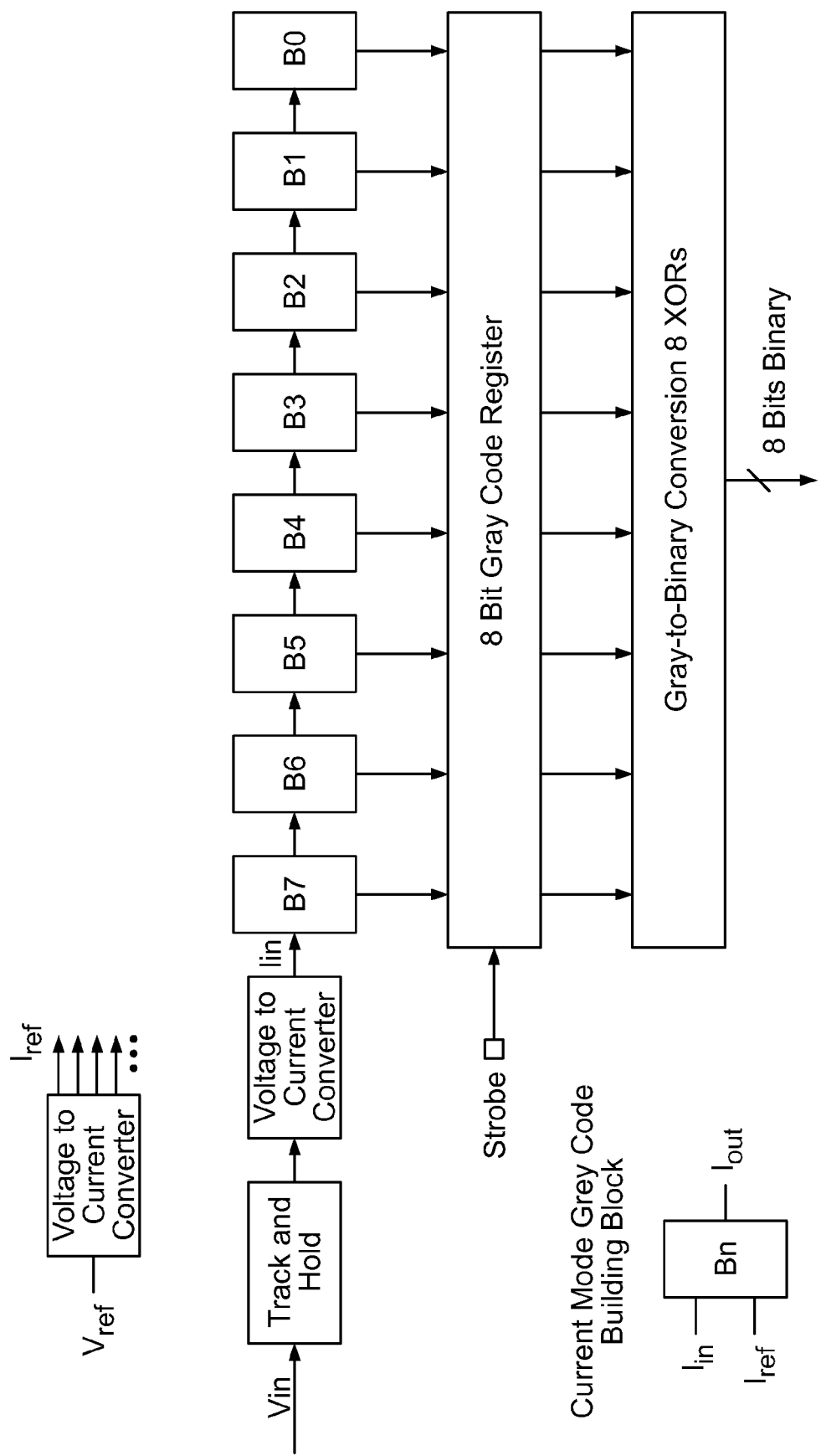
FIG. 3 shows a Gray code current-mode ADC converter of one embodiment.
Figure 4:
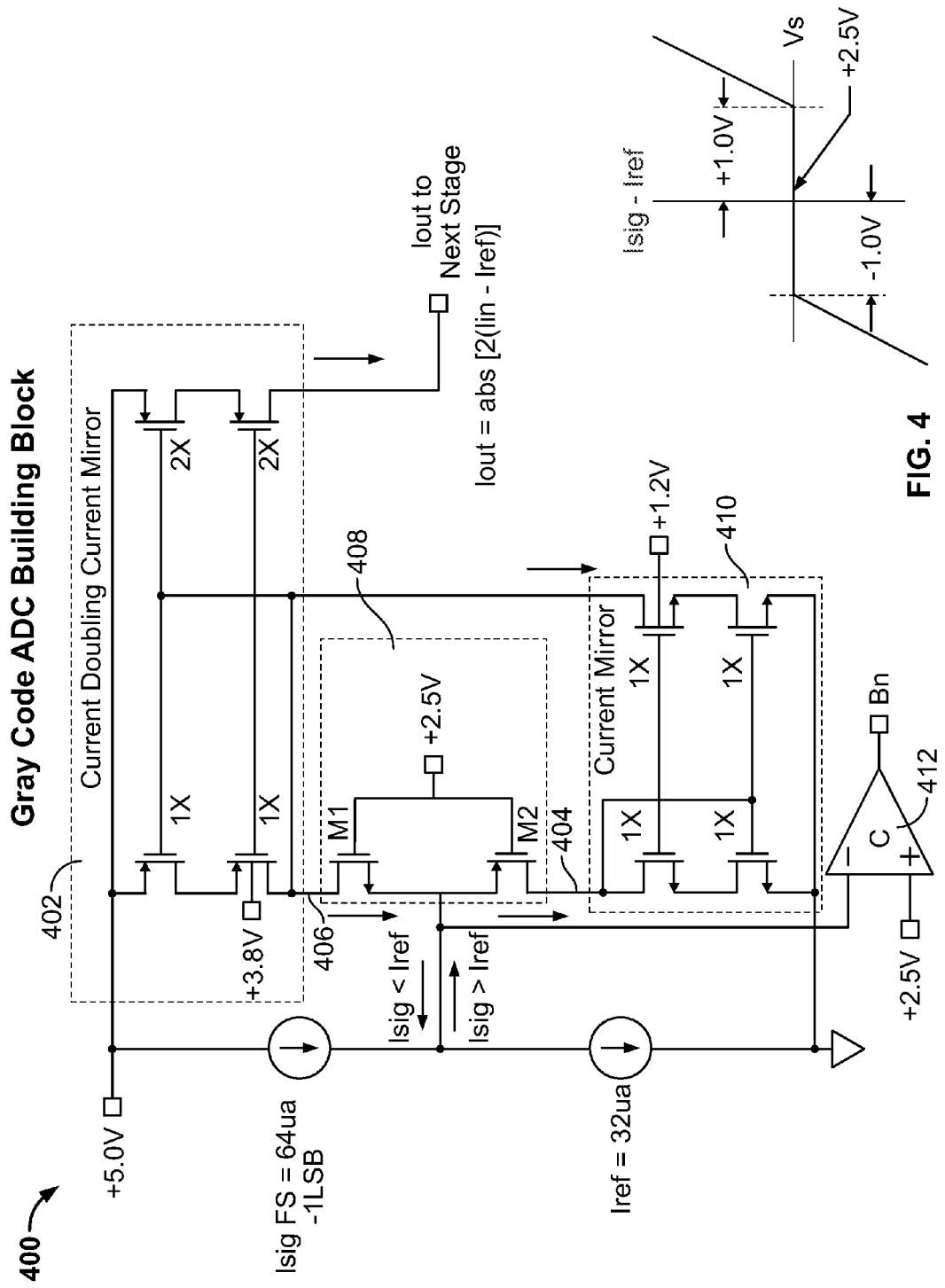
FIG. 4 shows an exemplary Gray code current mode building block of one embodiment.

FIG. 3 shows an exemplary current-mode ADC Gray code converter that can use current-mode Gray code ADC building blocks of FIG. 4. FIG. 4 shows a current mode (as opposed to voltage mode) implementation of the algorithm utilizing current steering and current mirrors. Hence the analog operator algorithm can be written as:

$$I_{out} = abs[2(I_{in} - I_{ref})]$$

Figure 6:
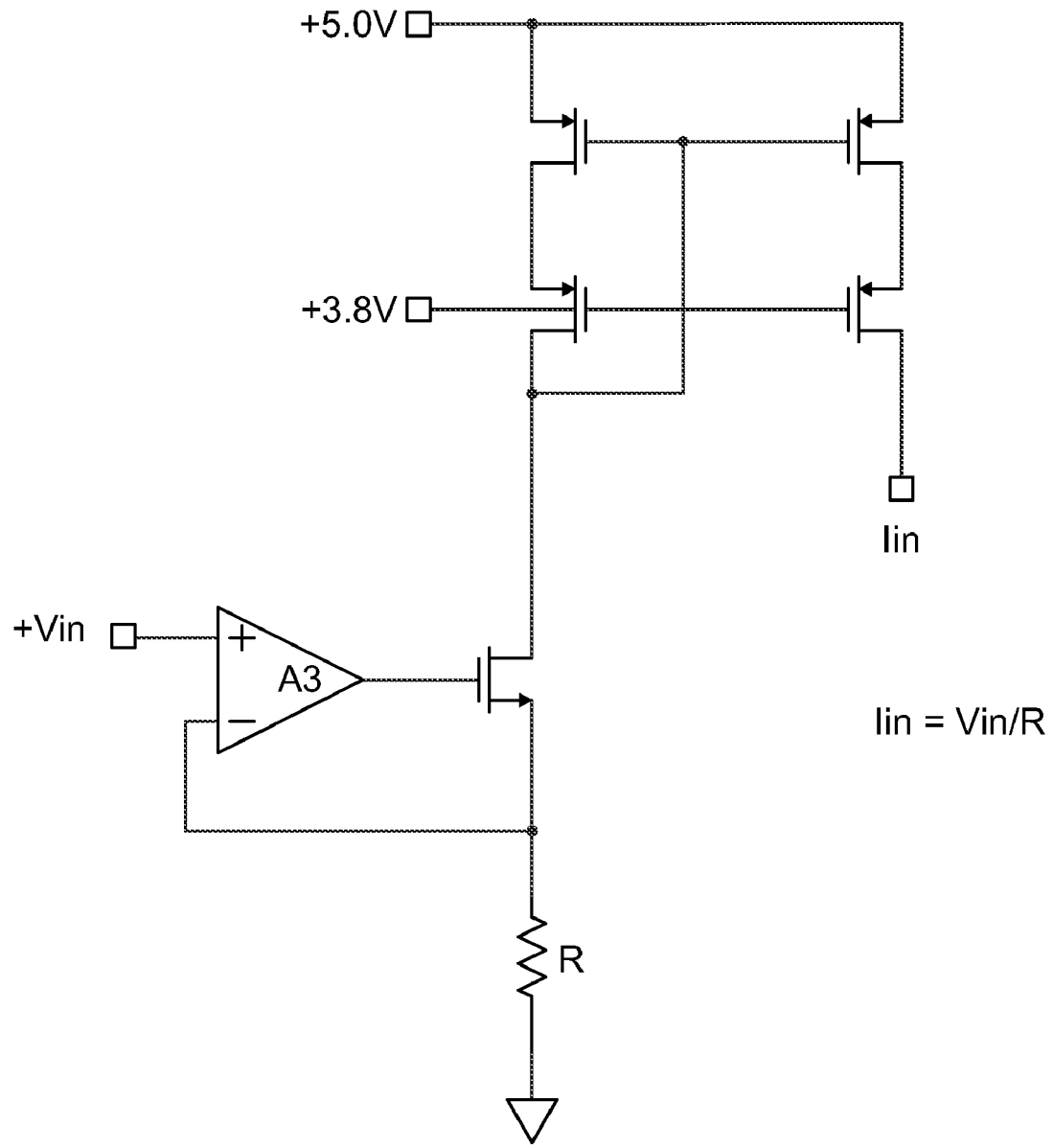
FIGS. 6 and 7, respectively, show circuits for the conversion of the input and reference voltage to an input and reference current.
Figure 7:
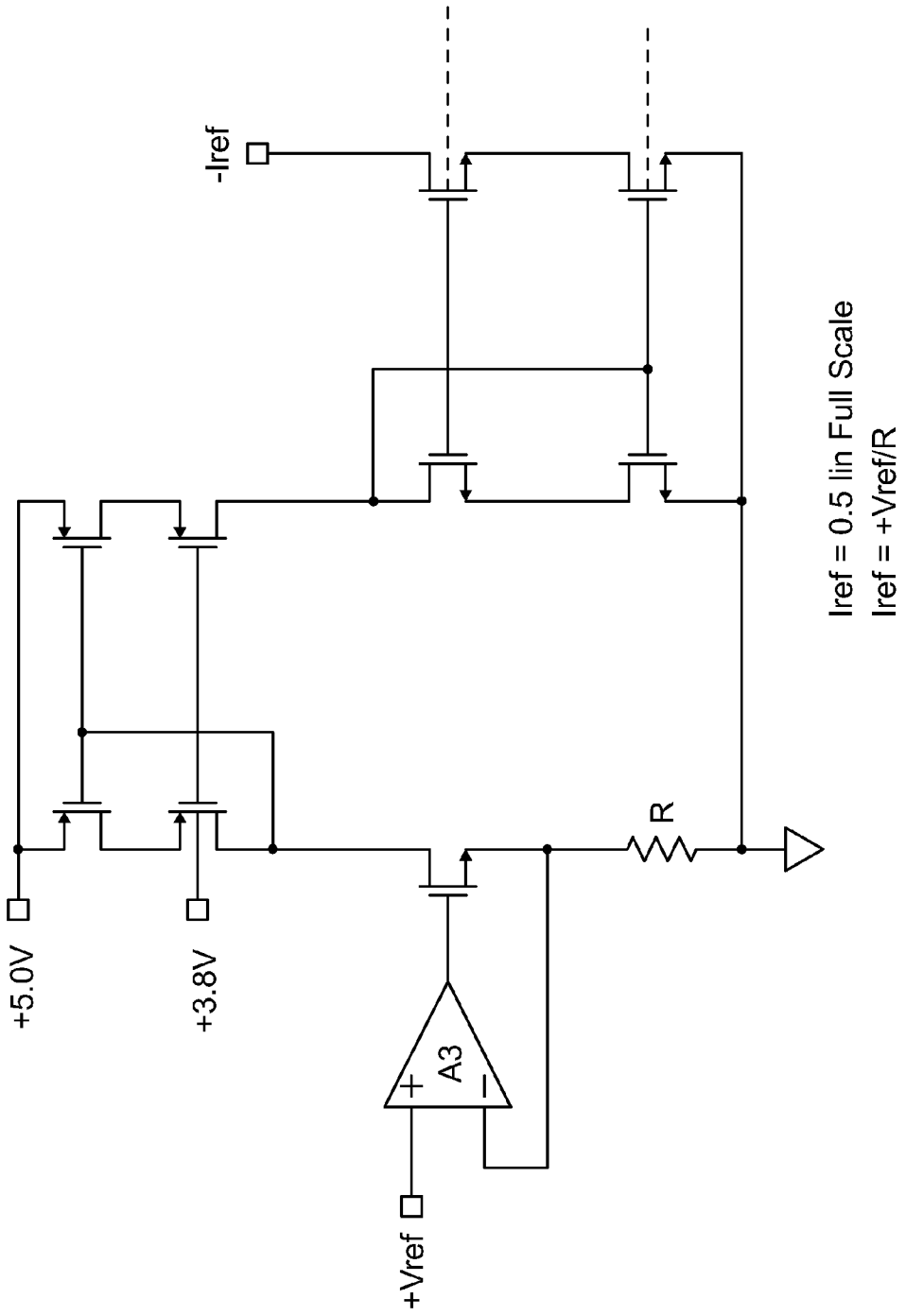
Figure 8:
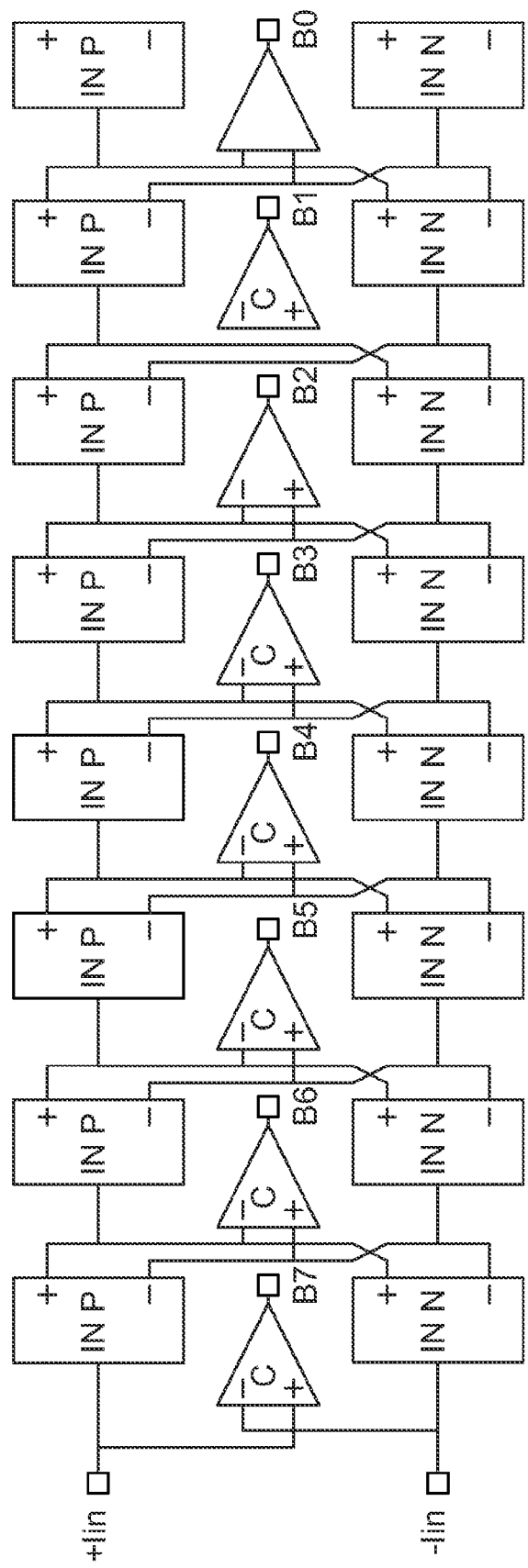
FIG. 8 shows a balanced differential architecture for a Gray code current-mode ADC.
Figure 9:
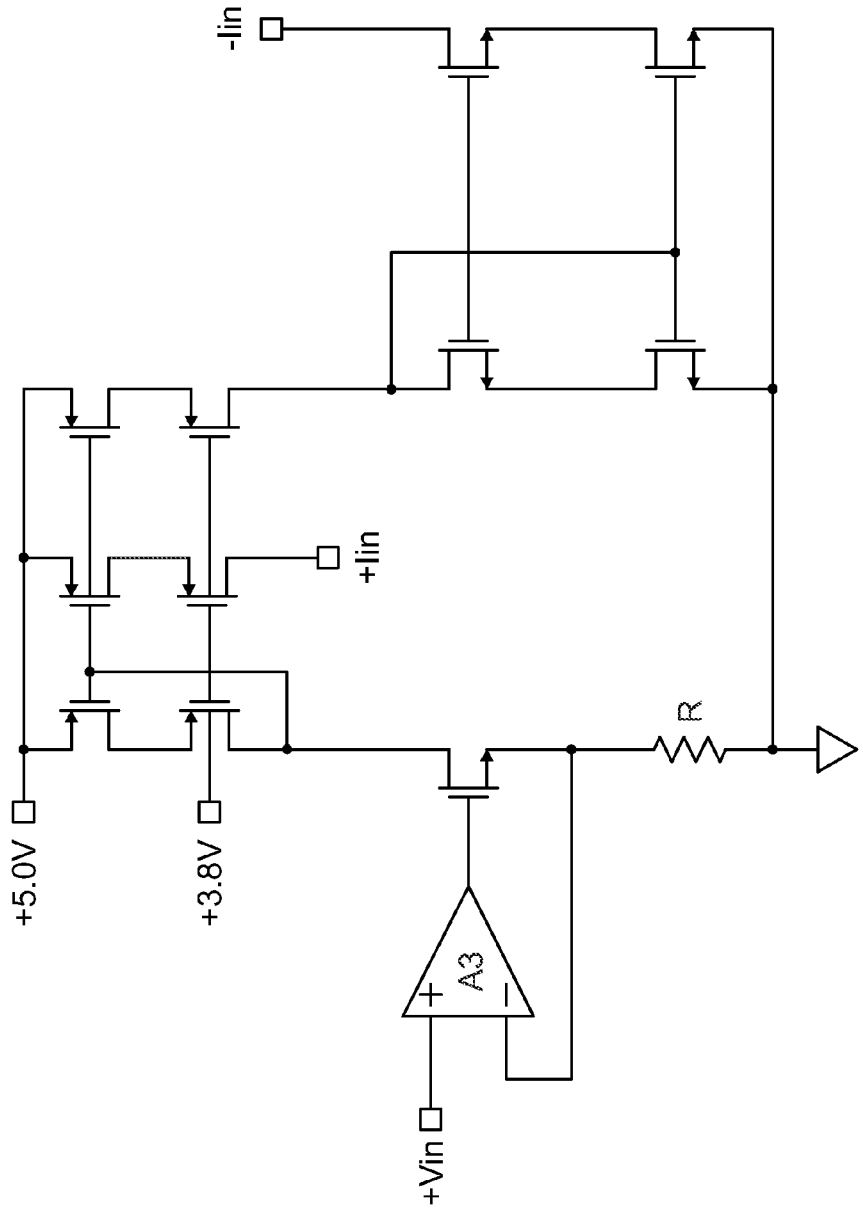
FIGS. 9 and 10, respectively, show exemplary circuits for the conversion of input and reference voltage to input and reference circuits for the balance a differential architecture of FIG. 8.
Figure 10:
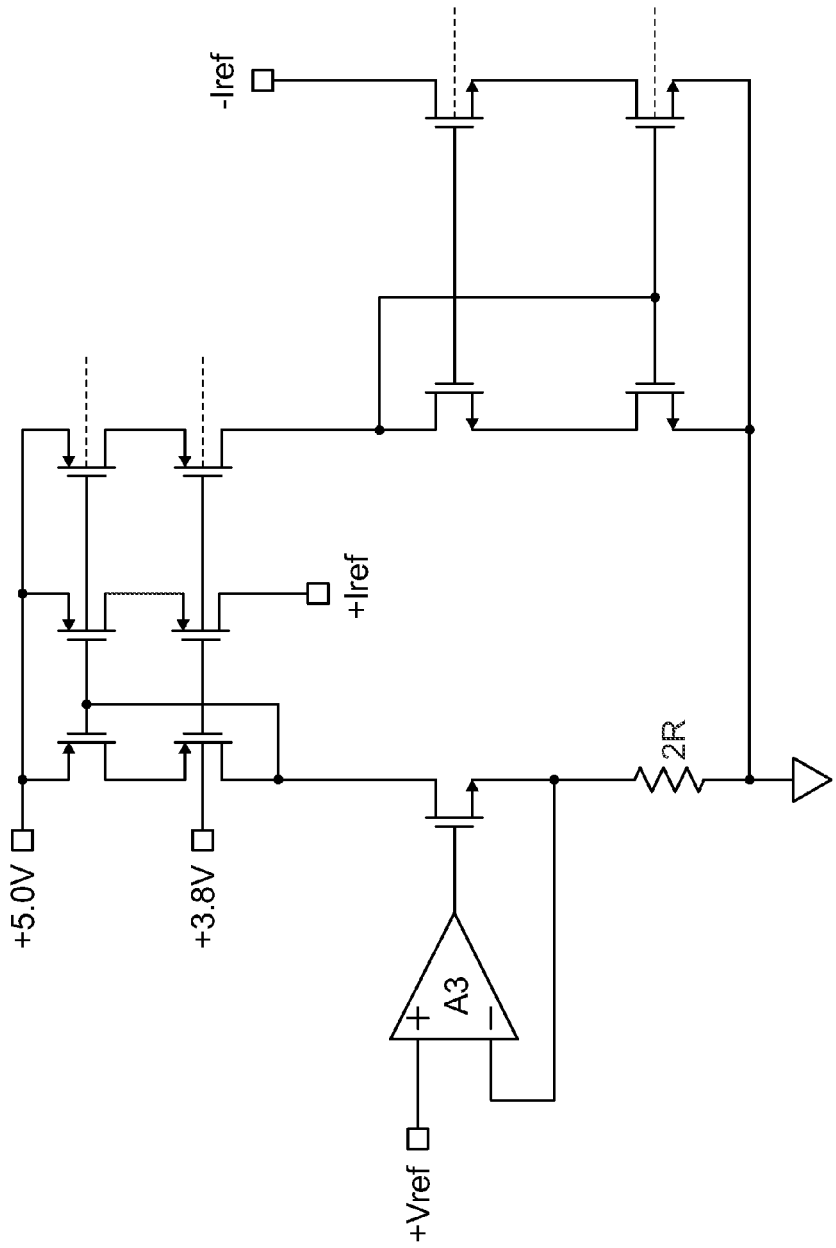

$V_{in}$ and $V_{ref}$ can be converted to currents via the V/I converters shown in FIG. 6 and 7.

In one embodiment, a Gray-code current-mode analog to digital (ADC) converter uses a Gray code current-mode ADC building block 400. The Gray code current-mode ADC building block 400 can be used to produce a Gray code bit, $B_n$, and a current output, $I_{out}$, that is sent to a next Gray code ADC building block. The Gray code current-mode ADC building block 400 need not use a voltage comparator in a signal path of the current output.

The Gray code current-mode ADC building block can include an output current mirror 402. The output current mirror 402 can double a current input into the output current mirror 402.

A pair 408 of transistors, M1 and M2, can be used to send a current with a value $|I_{sig} - I_{REF}|$ in a first path 404 if $I_{sig} > I_{REF}$ and down a second path 406 if $I_{sig} < I_{REF}$.

In this example, transistor M1 blocks current flowing to the pair from the building block input and transistor M2 blocks current flowing away from the pair to the building block input.

The current output need not be clocked before flowing to the next Gray code ADC building block.

A polarity inverting current mirror 410 can be used to invert the polarity of one possible input to the output current mirror 402. In this way, the polarity of the current output of the Gray code current-mode ADC building block can be the same whether $V_{sig} > V_{ref}$ or $V_{sig} < V_{ref}$.

In the example of FIG. 4, $I_{in}$ and Vref are summed at Vs. If $I_{in} < I_{ref}$ the resulting remainder is routed to the source of transistor M1, producing a negative voltage at Vs relative to $V_{bias}$. This current is then routed through the 2× P-channel current mirror 402.

If $I_{in} > I_{ref}$ the resulting remainder is routed to the source of transistor M2, producing a positive voltage at $V_s$ relative to $V_{bias}$(+2.5V). This current is then routed through the 1× N-channel current mirror 410 and then through the 2× P-channel current mirror 402.

In this example, there is no comparator involvement in the remainder current steering. The current steering is an intrinsic part of the processor circuit topology. The comparator 412 acts merely as an observer in determining the state of the bit and its propagation delay does not contribute significantly to the total conversion time.

In this example, the voltage excursion at Vs can be at least VT-Nch+VT-Pch or approx. 1.2V for a typical 0.5 um CMOS process. This greatly simplifies the design of the comparator since it need not be a precision, low offset device with high gain. It simply has to detect an approx. 1.2V transition centered on +2.5V in this example.

This straightforward implementation of the Gray code algorithm, however, can have limitations in speed and accuracy.

In one embodiment, the relatively large voltage excursion at $V_s$ (approx. 1.2V) can create a voltage compliance issue on the signal input current, $I_{in}$, the reference current $I_{ref}$ and the output current $I_{out}$. This affects the accuracy of the conversion.

The source impedance looking into Vs can be large (>15KΩ) when the remainder current is small, on the order of ½ LSB, as an example. A converter with 256 ua full scale has a ½ LSB value of 0.5 ua. This high resistance, combined with source and parasitic capacitances can create a time constant that becomes the first order limitation to converter speed.

The propagation delay through the analog Operator chain can be code dependent. If the remainder current at the $V_s$ node is negative, the current routes through transistor M1 and one current mirror to $I_{out}$. If the remainder current is positive it is routed through transistor M2 and two current mirrors to $I_{out}$. Although the time difference for each stage can be small, on the order of <5 ns, the worst case delta delay can be as much as 40 ns for an 8 bit converter.

Figure 5:
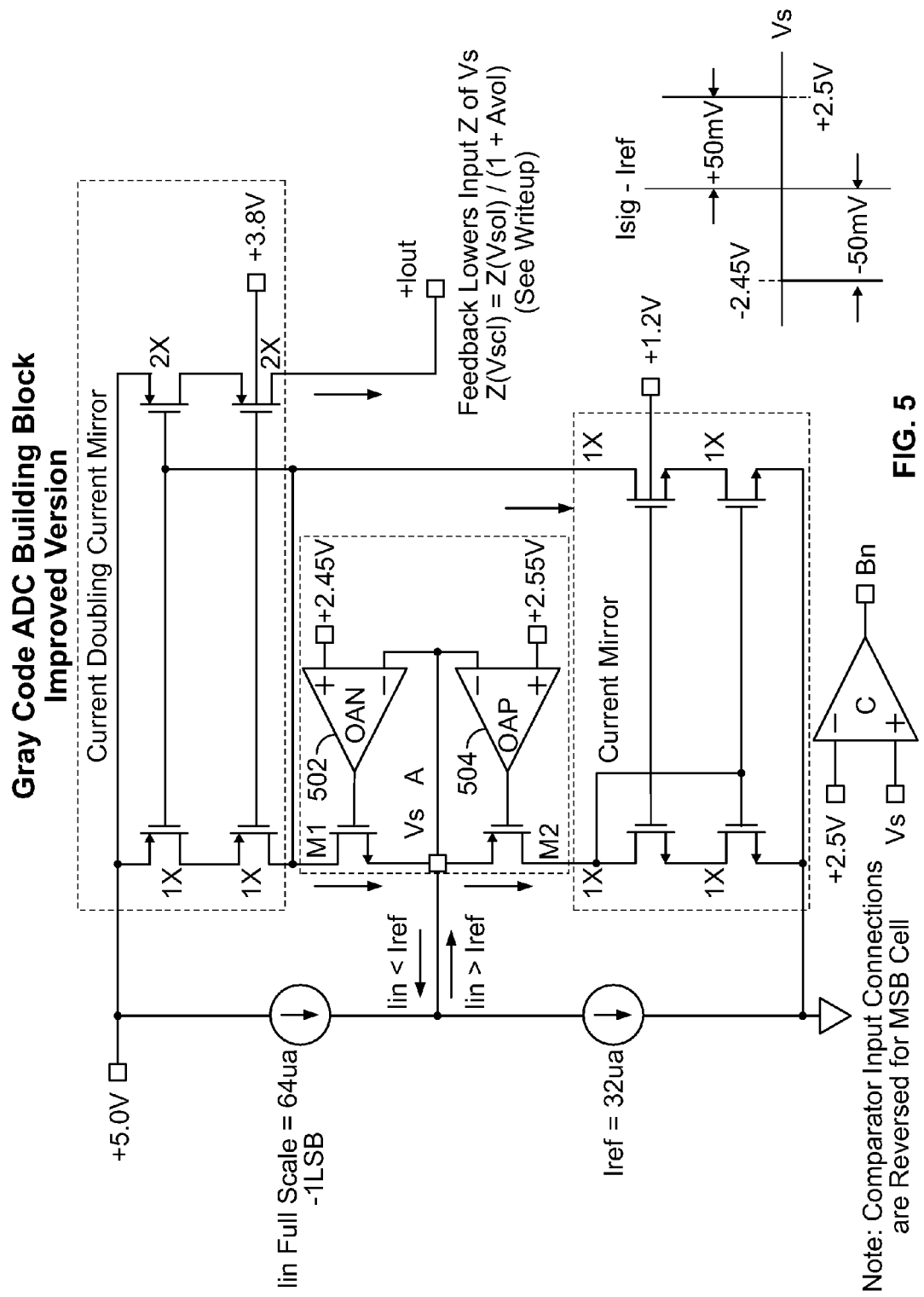
FIG. 5 shows a Gray code current mode building block of one embodiment using OP AMP feedback.

As shown in FIG. 5, Operational Amplifiers (Op amps) 502 and 504 can be used to provide feedback to the pair of transistors.

The schematic in FIG. 5, resolves issues, with respect to the voltage compliance and source impedance. Op amps, 502 and 504, place transistors M1 and M2 each in a closed loop configuration. One loop or the other is activated by the polarity of the remainder current injected at Vs. In this example, Op amp 502 is referenced 100 mV lower than Op amp 504 (+2.45V vs +2.55V). This offset prevents contention of the Op amps around Vs, guaranteeing that only one has the loop closed with the other biased out of the circuit. The results are twofold. First, the voltage excursion at $V_s$ is limited to 100 mV. This greatly reduces the voltage compliance requirement on $I_{in}$, $I_{ref}$ and $I_{out}$ current sources and greatly improves overall DC accuracy. Secondly, the input impedance Zs looking into Vs is reduced by the following factor:

$Z(Vscl)=Z(Vsol)/(1+Avol)$ where
Z(Vscl)=Input impedance closed loop
Z(Vsol)=Input impedance Open loop
Avol=Open loop gain of A1, A2

Simulations have indicated that a factor of 50 to 100 reductions in Zs can be achieved.

Figure 11:
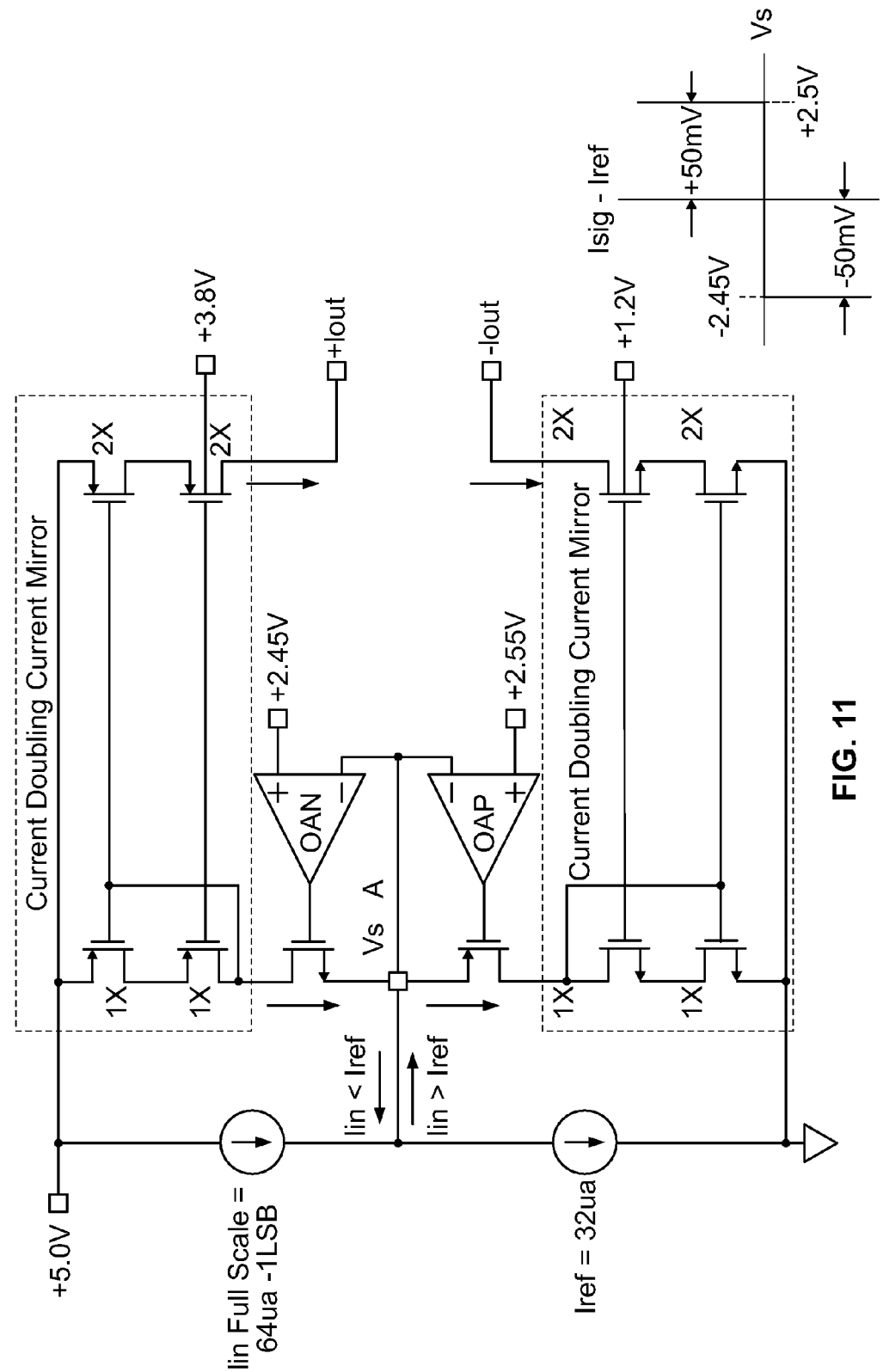
FIGS. 11 and 12, respectively, show positive and negative input Gray code current-mode building blocks for the balance differential architecture of FIG. 8.
Figure 12:
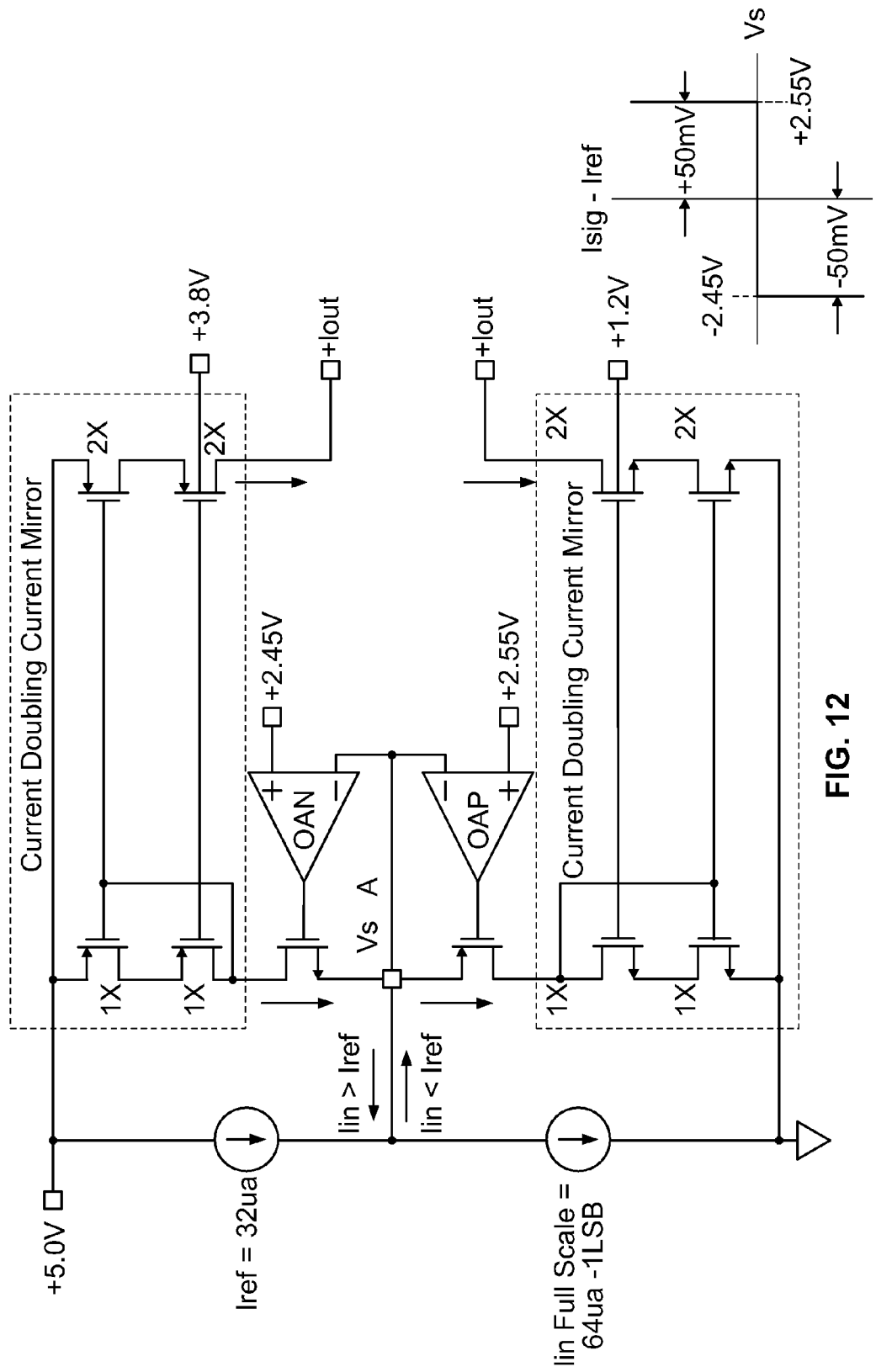
Figure 13:
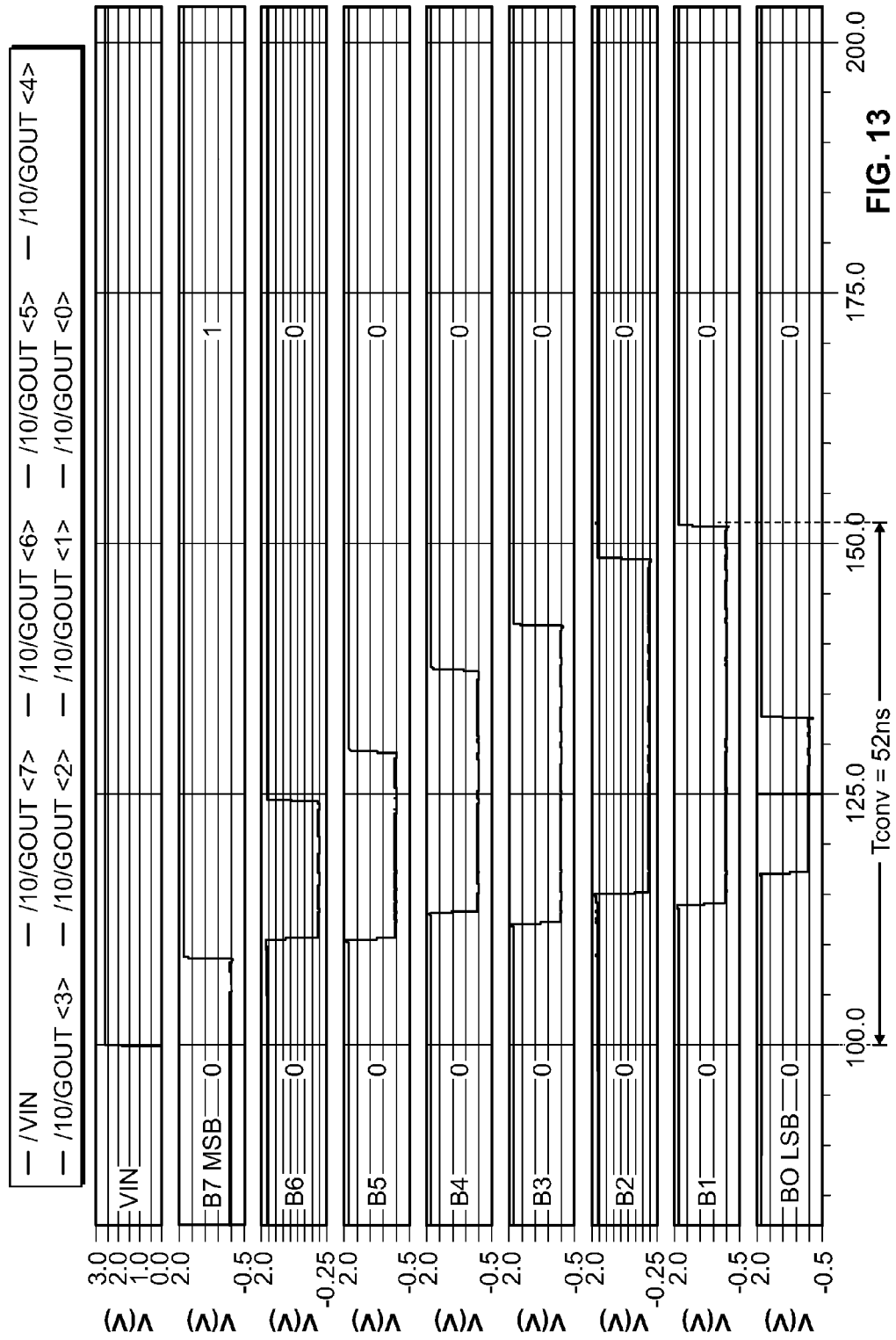
FIGS. 13-20 show the simulated performance of the balanced differential architecture of FIG. 8.

Dealing with the issue of code dependent propagation delay, can be fixed with a change in both converter and analog Operator architecture as shown in FIGS. 9 through 13. The building blocks now have 2 versions, P and N, one for positive input currents, $I_{NP}$, and the other for negative input currents, $I_{NN}$, as shown in FIGS. 12 and 13. In addition, both have positive and negative remainder outputs. Now, the propagation delay through each Operator is, to a first order, independent of input current polarity.

In one embodiment, two Gray code current-mode ADC building blocks are used to produce a single Gray code bit. In one example, a first path goes to the output current mirror, and wherein a second path goes to a second output current mirror.

The converter architecture shown in FIG. 11 can take the form of a balanced differential topology. It can use 2 analog Operators per bit and can operate with the following rule:

The input to the converter is presented as a balanced differential current $+I_{in}$, $-I_{in}$. See FIG. 10.

If the current output of a P Operator is positive, it is routed to the positive input of the next cascaded P Operator. If the current output is negative, it is crossed over and routed to the input of the next cascaded N Operator If the current output of an N Operator is negative, it is routed to the negative input of the next cascaded N Operator. If the current output is positive, it is crossed over and routed to the input of the next cascaded P Operator.

The bit sensing comparators now have a balanced differential signal as input. This 2× increase in comparator overdrive can simplify comparator design.

This configuration offers the possibility for achieving maximum converter resolution and speed at reasonably low power dissipation with the Gray code algorithm, albeit at the expense of a significant increase in circuit complexity.

Figure 14:
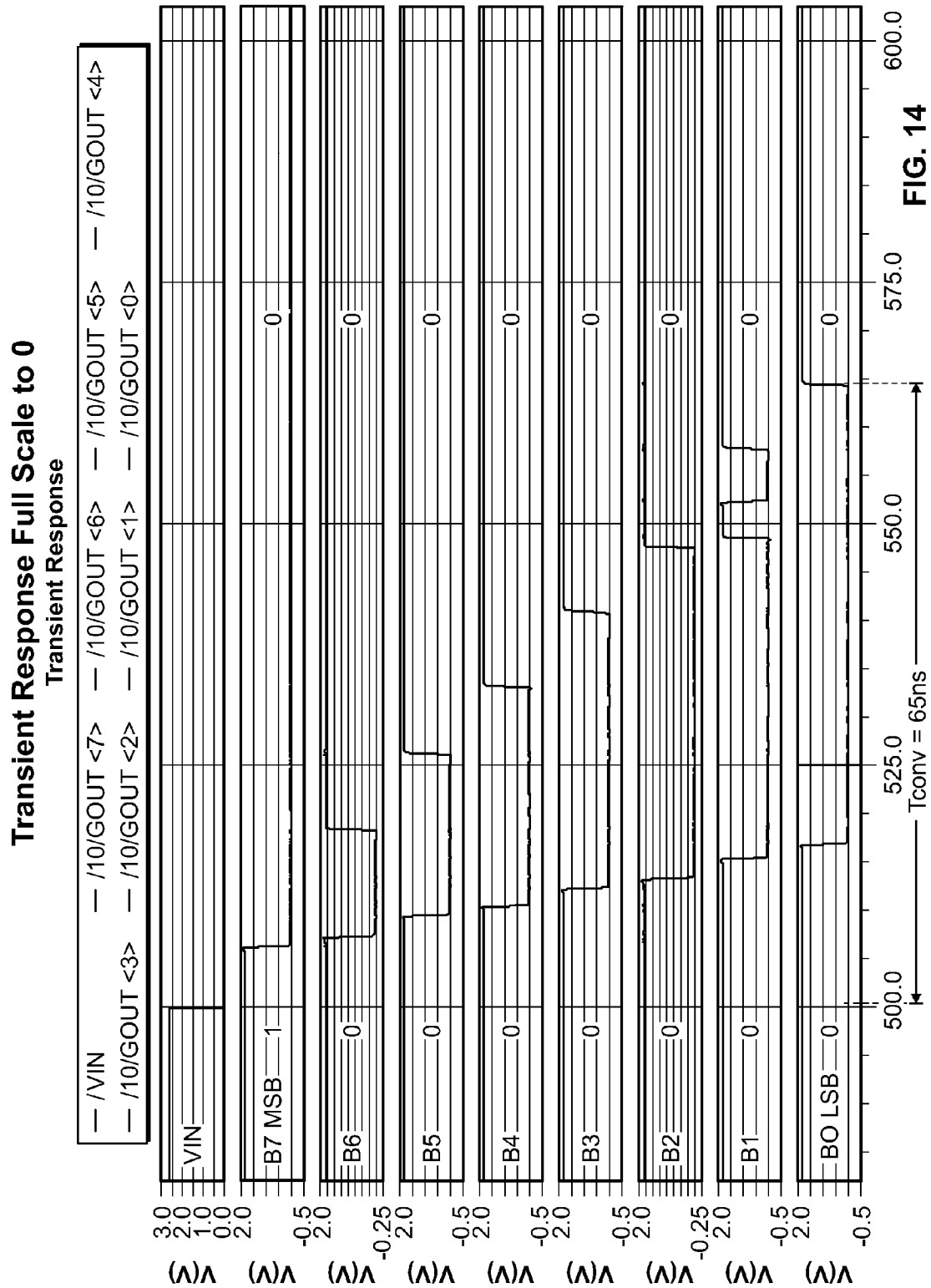

FIGS. 13-20 show simulated performance of one embodiment. FIG. 13 shows converter performance at 8 bits for a zero to full scale input of +2.55V. Conversion time is 52 ns. FIG. 14 shows converter performance at 8 bits for a full scale to zero input of +2.55V. Conversion time is 65 ns. This input transition is considered worst case for conversion time. Note that the output is Gray code with B7=MSB and B0=LSB.

Figure 15:
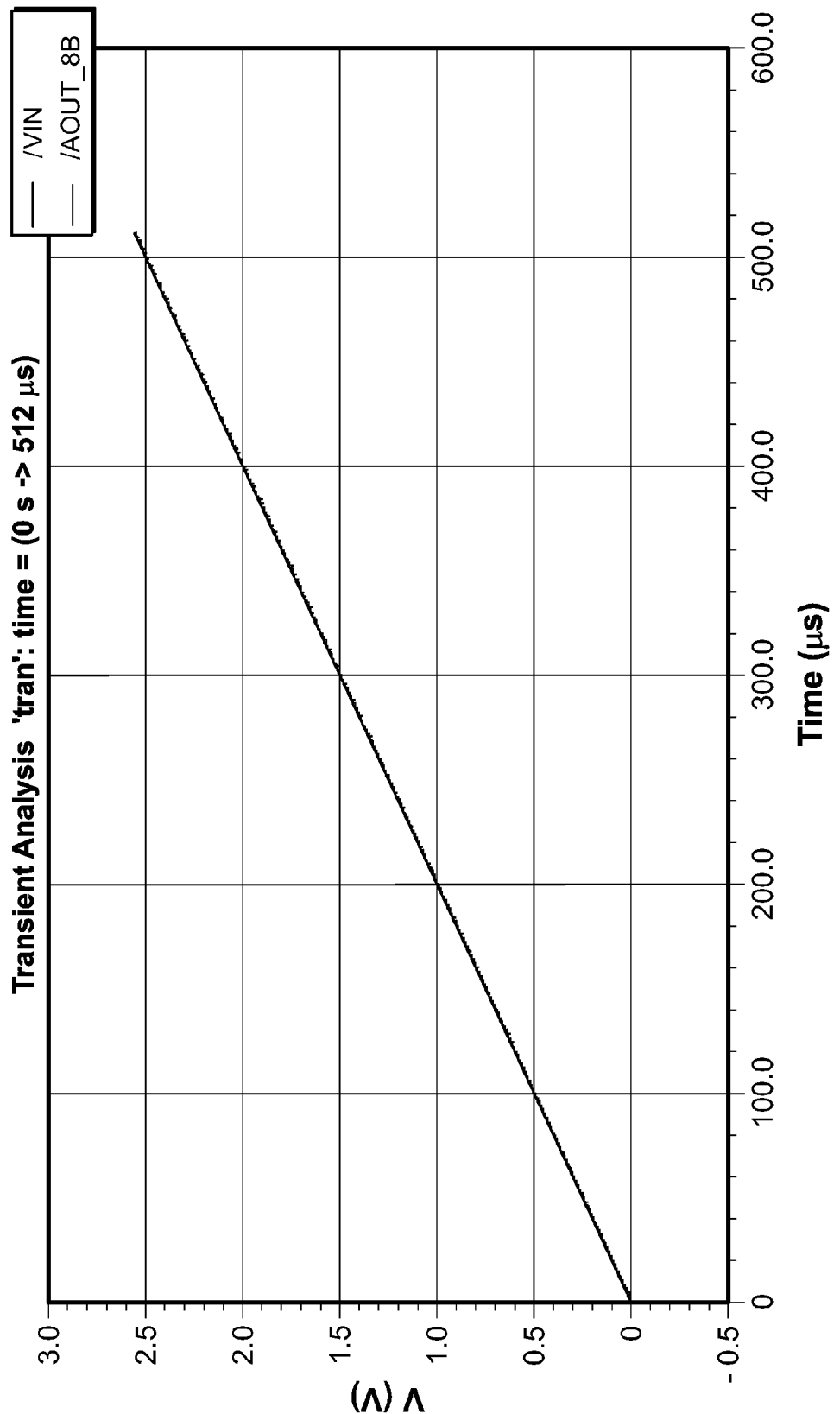
Figure 16:
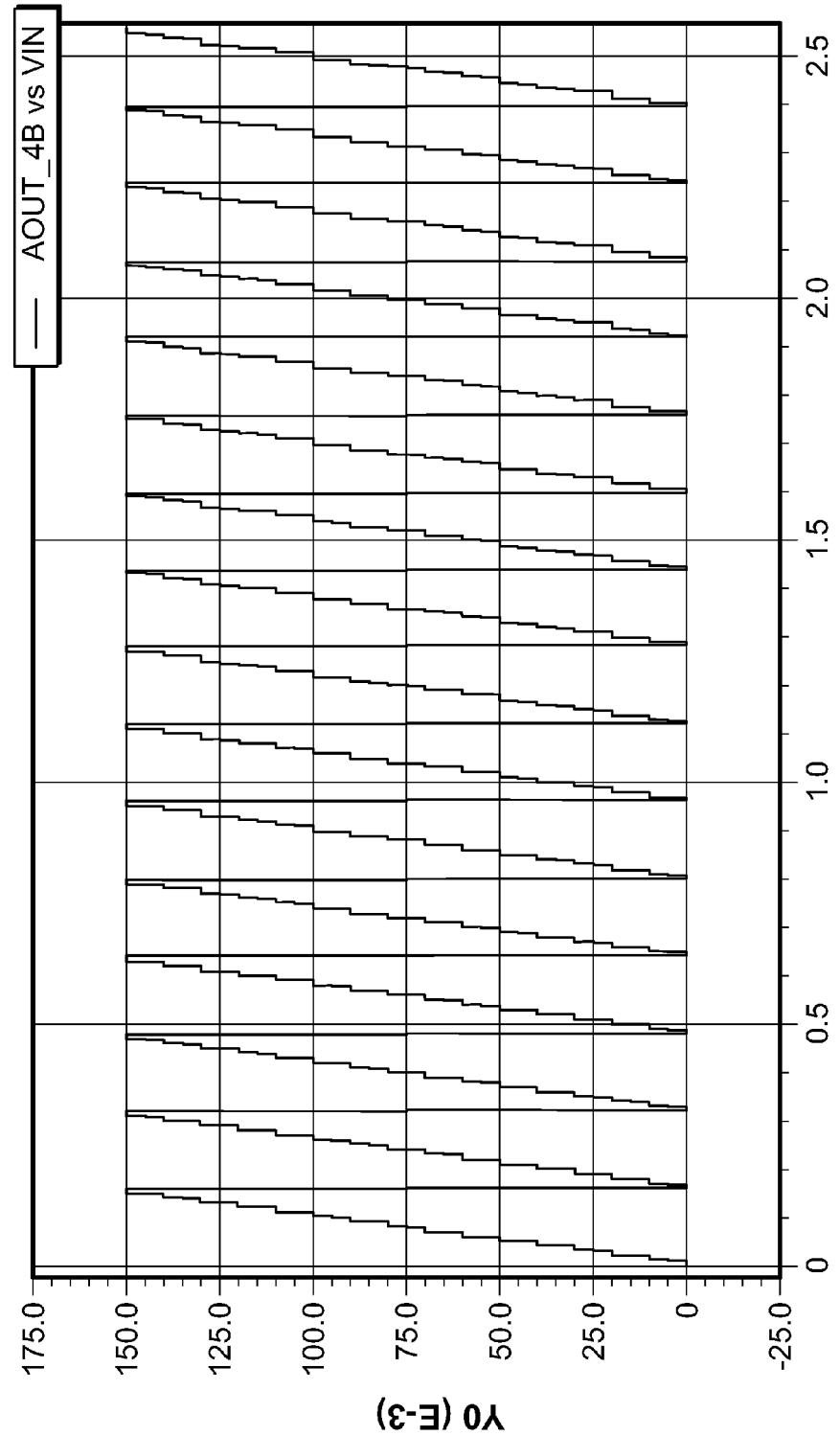
Figure 17:
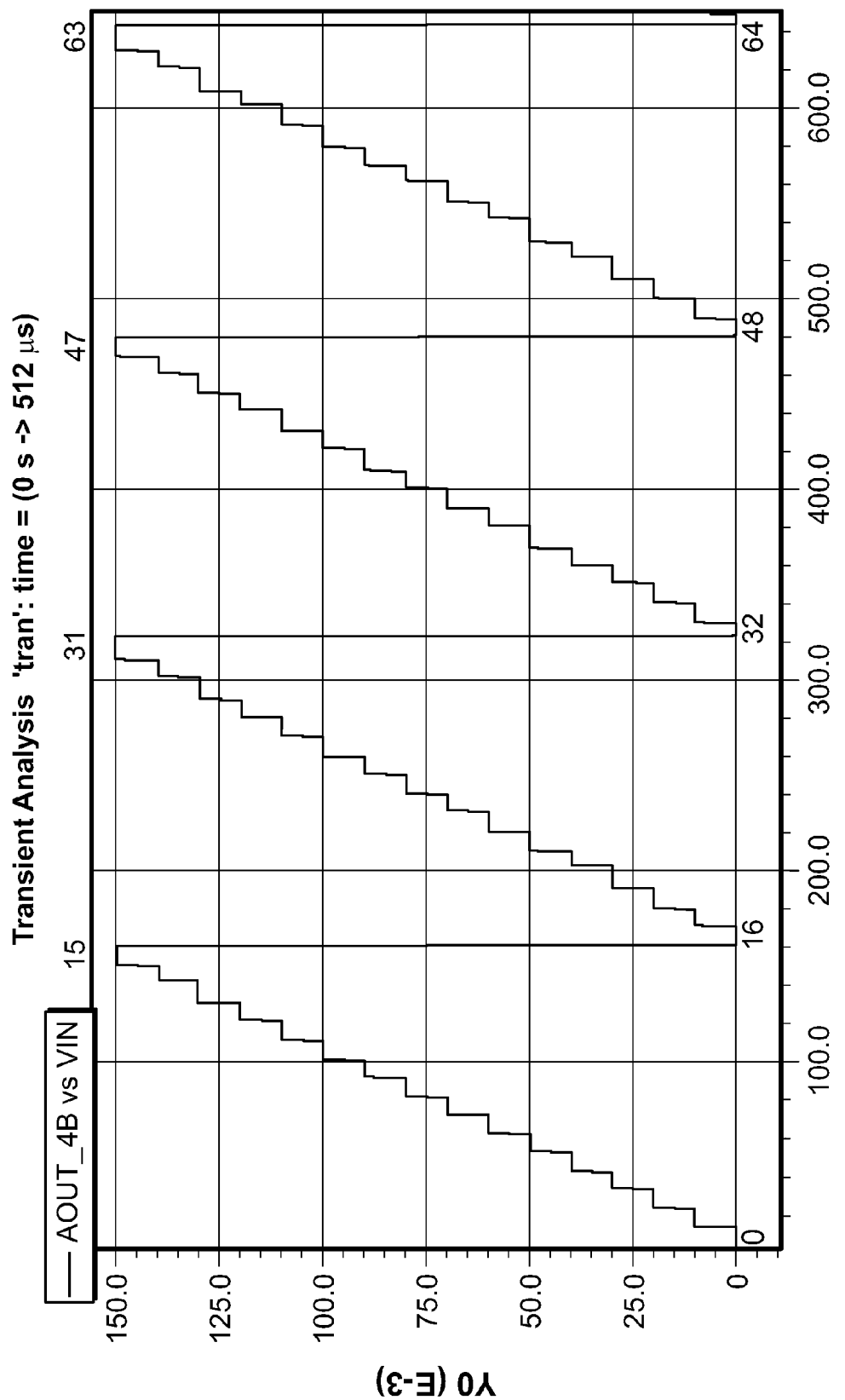
Figure 18:
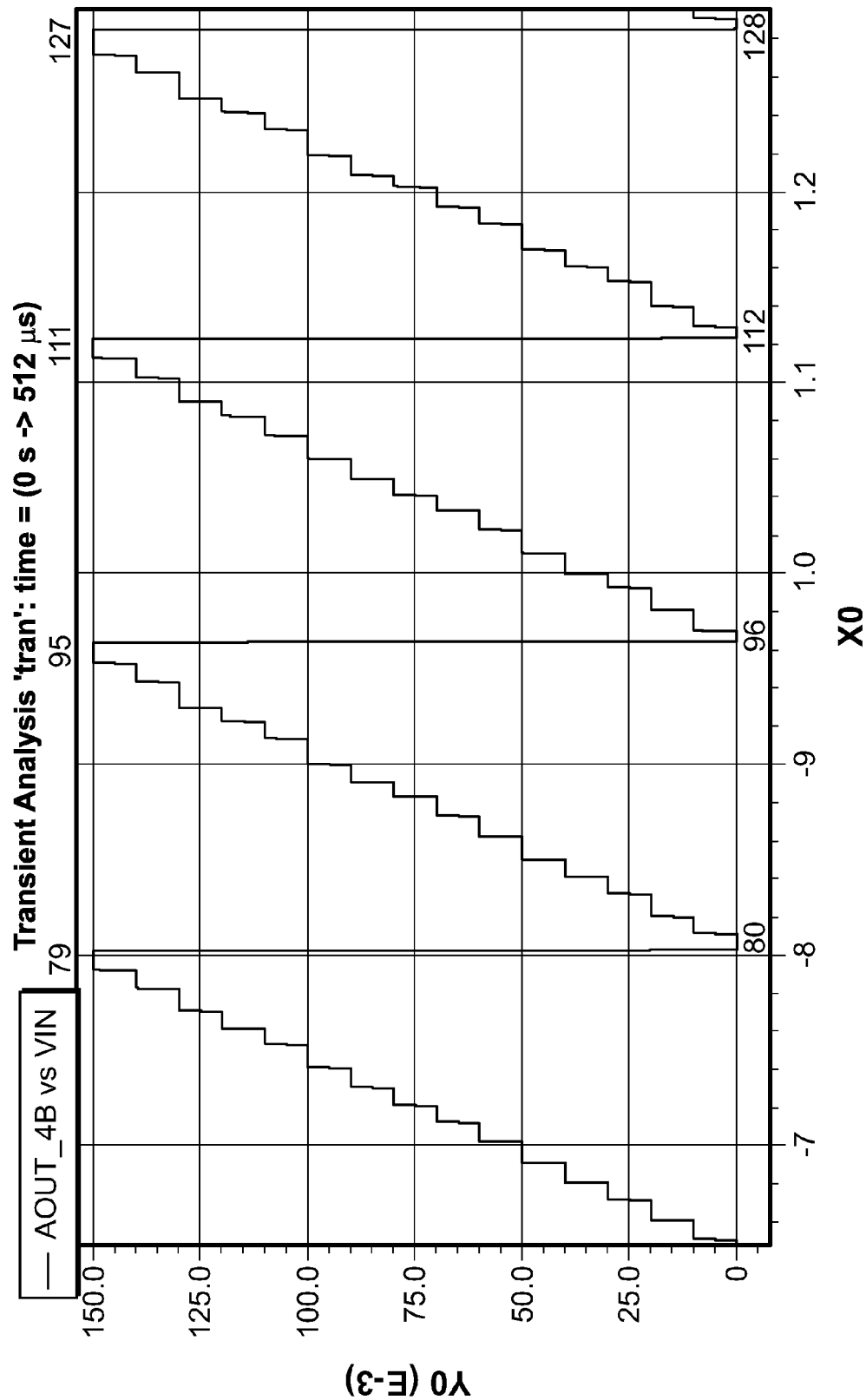
Figure 19:
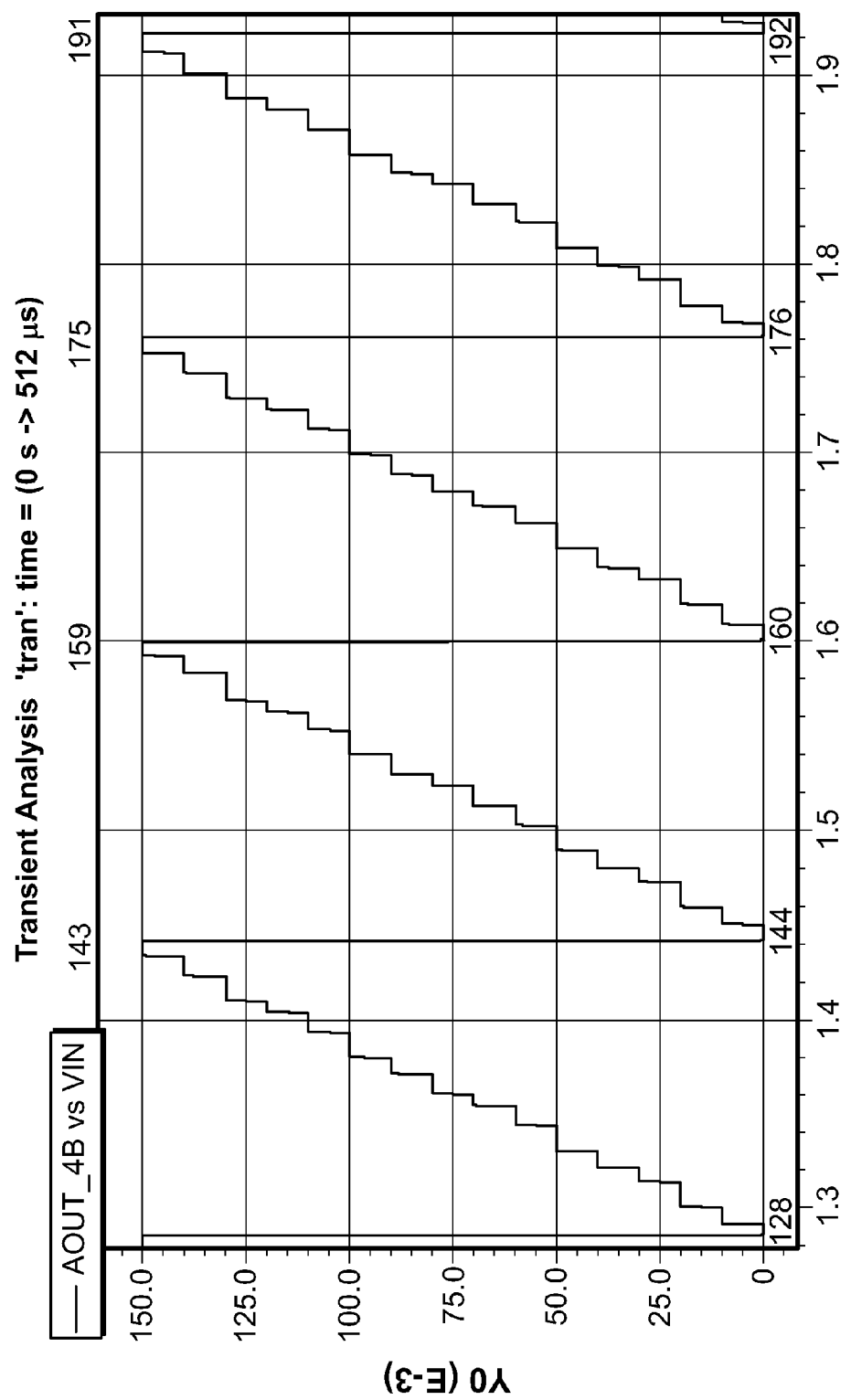
Figure 20:
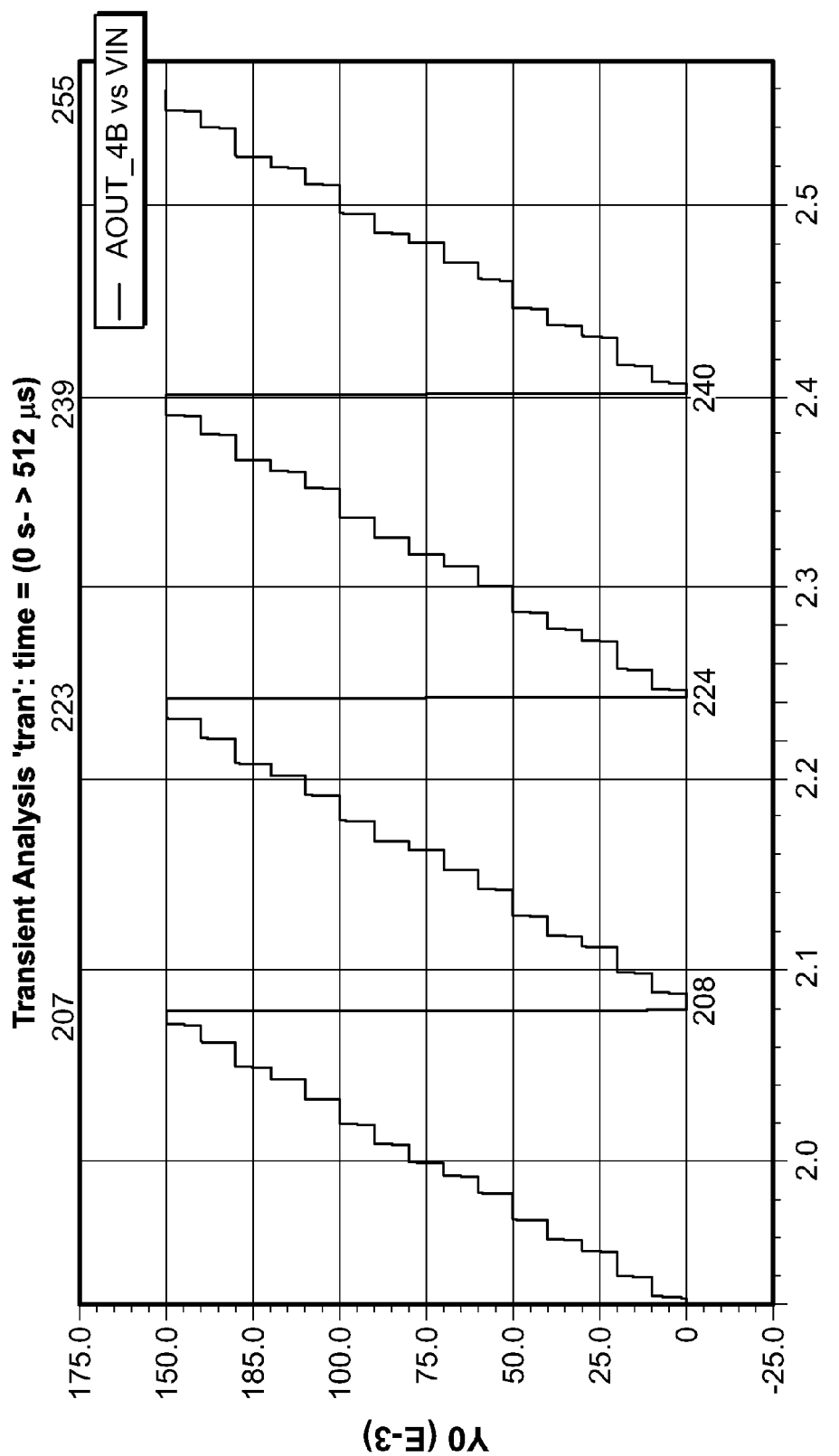

FIG. 15 shows a worst case integral non-linearity of ±0.5 LSB at 8 bits of resolution.

FIGS. 16 through 20 show a worst case differential non-linearity of less than ±0.5 LSB at 8 bits with no missing codes. This guarantees monotonic in the analog-digital transfer function.

FIG. 21 is a block diagram of an asynchronous, unclocked, 12 bit, 200 ns conversion time ADC implemented with two 4 bit and one 6 bit Grey code converters utilizing a 3 pass residue generation algorithm. Projected power dissipation is less than 25 mW with a +5.0V supply.

The foregoing description of preferred embodiments of the present invention has been provided for the purposes of illustration and description. It is not intended to be exhaustive or to limit the invention to the precise forms disclosed. Many embodiments were chosen and described in order to best explain the principles of the invention and its practical application, thereby enabling others skilled in the art to understand the invention for various embodiments and with various modifications that are suited to the particular use contemplated. It is intended that the scope of the invention be defined by the claims and their equivalents.

The invention claimed is:

1. A Gray code current-mode analog to digital (ADC) converter using a Gray code current-mode ADC building block, the Gray code current-mode ADC building block being used to produce a Gray code bit and a current output that is sent to a next Gray code ADC building block, wherein the Gray code current-mode ADC building block does not use a voltage comparator in a signal path of the current output;

wherein a pair of transistors are used to cause a current in a first path if $I_{sig}>I_{REF}$ and down a second path if $I_{sig}<I_{REF}$; and wherein Op amps are used to provide feedback to the pair of transistors.

2. The Gray code current-mode ADC converter of claim 1; wherein the Gray code current-mode ADC building block includes an output current mirror.

3. The Gray code current-mode ADC converter of claim 2; wherein the output current mirror doubles a current input into the output current mirror.

4. The Gray code current-mode ADC converter of claim 3, further comprising a polarity inverting current mirror to invert the polarity of one possible input to the output current mirror.

5. The Gray code current-mode ADC converter of claim 1; wherein the current output is not clocked before flowing to the next Gray code current-mode ADC building block.

6. The Gray code current-mode ADC converter of claim 1; wherein two Gray code current-mode ADC building blocks are used to produce a single Gray code bit.

7. The Gray code current-mode ADC converter of claim 1, wherein one of the Op amps is referenced to a first voltage and another of the Op amps is referenced to a second voltage less than the first voltage to prevent contention between the Op amps.

8. The Gray code current-mode ADC converter of claim 7, wherein the pair of transistors are connected at a node and the voltage excursion at the node is limited to the first voltage minus the second voltage.

9. The Gray code current-mode ADC converter of claim 8, wherein the first voltage minus the second voltage is about 100 mV.

10. The Gray code current-mode ADC converter of claim 1, wherein the pair of transistors are connected at a node; and wherein the Op amps reduce the input impedance at the node.

11. A Gray code current-mode ADC building block for a Gray code current-mode Analog to Digital (ADC) converter comprising:
a pair of transistors operably connected to a current input, $I_{sig}$, and reference current, $I_{REF}$, wherein a current output of the pair of transistors is formed in a first path if $I_{sig}>I_{REF}$ and in a second path if $I_{sig}<I_{REF}$;
an output current mirror that doubles an input current to the current mirror to produce a current output of the Gray code current-mode ADC building block that is sent to the next Gray code current-mode ADC building block; wherein the Gray code current mode ADC building block also produces a Gray code bit; and
wherein Op amps are used to provide feedback to the pair of transistors.

12. The Gray code current-mode ADC building block of claim 11;
wherein the current output is not clocked before flowing to the next Gray code ADC building block.

13. The Gray code current-mode ADC building block of claim 11, further comprising a polarity inverting current mirror to invert the polarity of one possible input to the output current mirror.

14. The Gray code current-mode ADC building block of claim 11;
wherein two Gray code current-mode ADC building blocks are used to produce a single Gray code bit.

15. The Gray code current-mode ADC building block of claim 11;
wherein the first path goes to the output current mirror; and
wherein a second path goes to a second output current mirror.

16. The Gray code current-mode ADC building block of claim 15;
wherein a pair of the Gray code current-mode ADC building blocks are used to produce a Gray code bit.

17. The Gray code current-mode ADC building block of claim 11, wherein one of the Op amps is referenced to a first voltage and another of the Op amps is referenced to a second voltage less than the first voltage to prevent contention between the Op amps.

18. The Gray code current-mode ADC building block of claim 17, wherein the pair of transistors are connected at a node and the voltage excursion at the node is limited to the first voltage minus the second voltage.

19. The Gray code current-mode ADC building block of claim 18, wherein the first voltage minus the second voltage is about 100 mV.

20. The Gray code current-mode ADC building block of claim 11, wherein the pair of transistors are connected at a node; and wherein the Op amps reduce the input impedance at the node.

* * * * *